United States Patent
Dokumaci et al.

(10) Patent No.: US 7,682,887 B2
(45) Date of Patent: Mar. 23, 2010

(54) TRANSISTOR HAVING HIGH MOBILITY CHANNEL AND METHODS

(75) Inventors: Omer H. Dokumaci, Wappingers Falls, NY (US); Woo-Hyeong Lee, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 351 days.

(21) Appl. No.: 11/557,509

(22) Filed: Nov. 8, 2006

(65) Prior Publication Data

US 2007/0087540 A1    Apr. 19, 2007

Related U.S. Application Data

(62) Division of application No. 10/905,948, filed on Jan. 27, 2005, now abandoned.

(51) Int. Cl.
   *H01L 21/338* (2006.01)
(52) U.S. Cl. ............... 438/175; 438/216; 438/226; 438/282; 257/E29.27
(58) Field of Classification Search ......... 438/174–178, 438/183, 184, 194, 526, 572, 216, 226, 282; 257/E29.27, 194
   See application file for complete search history.

(56) References Cited

U.S. PATENT DOCUMENTS

| | | | |
|---|---|---|---|
| 5,312,766 A | 5/1994 | Aronowitz et al. | |
| 6,033,963 A | 3/2000 | Huang et al. | |
| 6,177,303 B1 | 1/2001 | Schmitz et al. | |
| 6,184,112 B1 | 2/2001 | Maszara et al. | |
| 6,239,463 B1 | 5/2001 | Williams et al. | |
| 6,310,367 B1* | 10/2001 | Yagishita et al. | 257/190 |
| 6,432,781 B2 | 8/2002 | Wasshuber | |
| 6,465,334 B1 | 10/2002 | Buynoski et al. | |
| 6,559,051 B1* | 5/2003 | Buynoski et al. | 438/678 |
| 6,566,734 B2* | 5/2003 | Sugihara et al. | 257/616 |
| 6,620,664 B2 | 9/2003 | Ma et al. | |
| 6,630,710 B1 | 10/2003 | Augusto | |
| 6,642,581 B2 | 11/2003 | Matsuda et al. | |
| 6,653,700 B2* | 11/2003 | Chau et al. | 257/412 |
| 6,667,199 B2 | 12/2003 | Torii et al. | |
| 6,743,680 B1 | 6/2004 | Yu | |

(Continued)

OTHER PUBLICATIONS

Martin, Suzanne C. et al., "p-Channel Germanium MOSFET's with High Channel Mobility," IEEE Electron Device Letters, vol. 10, No. 7, Jul. 1989, pp. 325-326.

*Primary Examiner*—Brook Kebede
(74) *Attorney, Agent, or Firm*—Katherine S. Brown; Hoffman Warnick LLC

(57) ABSTRACT

Methods and resulting structure of forming a transistor having a high mobility channel are disclosed. In one embodiment, the method includes providing a gate electrode including a gate material area and a gate dielectric, the gate electrode being positioned over a channel in a silicon substrate. A dielectric layer is formed about the gate electrode, and the gate material area and the gate dielectric are removed from the gate electrode to form an opening into a portion of the silicon substrate that exposes source/drain extensions. A high mobility semiconductor material, i.e., one having a carrier mobility greater than doped silicon, is then formed in the opening such that it laterally contacts the source/drain extensions. The gate dielectric and the gate material area may then be re-formed. This invention eliminates the high temperature steps after the formation of high mobility channel material used in related art methods.

13 Claims, 4 Drawing Sheets

U.S. PATENT DOCUMENTS

| | | |
|---|---|---|
| 6,756,277 B1 | 6/2004 | Yu |
| 6,916,694 B2 * | 7/2005 | Hanafi et al. ............... 438/166 |
| 2002/0052084 A1 | 5/2002 | Fitzgerald |
| 2003/0080361 A1 | 5/2003 | Murthy et al. |
| 2003/0146428 A1 | 8/2003 | Ma et al. |

* cited by examiner

TRANSISTOR HAVING HIGH MOBILITY CHANNEL AND METHODS

This application is a divisional application of application Ser. No. 10/905,948, filed Jan. 27, 2005 now abandoned.

BACKGROUND OF THE INVENTION

1. Technical Field

The present invention relates generally to semiconductor device fabrication, and more particularly, to methods of forming a transistor, and the transistor so formed, including a channel of a high mobility semiconductor material.

2. Related Art

Semiconductor devices have continued to decrease in size. One challenge facing continued size reduction is developing high performance devices with smaller gate lengths. One approach to increase performance with smaller gate lengths is to increase the carrier mobility, i.e., electron and/or hole, in the channel. Although it is possible to obtain higher carrier mobilities with strained silicon, much higher mobilities can be achieved by using a different semiconductor material in the channel other than silicon. For example, hole mobility in silicon-germanium (SiGe) and germanium (Ge) is known to be much higher than in silicon. However, using a bulk material other than silicon presents huge integration and device design challenges. For example, defects due to the relaxation of SiGe are a large problem. In addition, diffusion enhancement of n-type dopants in SiGe and Ge makes it very challenging to obtain advantageous ultra-shallow junctions. Moreover, most of the process steps such as silicidation and surface cleaning are currently unsatisfactory. As a result, it continues to be easier and cheaper to use silicon as a bulk material and use the high mobility materials only in the channel.

In order to achieve a SiGe or Ge channel transistor structure, SiGe or Ge can be epitaxially grown on silicon to include a strain. Unfortunately, however, exposure of these materials to required high temperature steps, e.g., for implant damage annealing, can relax the strain, causing a multitude of defects to form. These defects can make the devices inoperative and/or can cause large yield losses. Moreover, high temperature steps can cause too much n-type dopant diffusion through these materials and can cause the source/drain regions to short, or can cause significant short channel effects. Strained materials such as SiGe exhibit better critical thickness and stability at lower temperatures. For example, a higher Ge concentration SiGe can be stable on silicon if it is grown and maintained at lower temperatures. Unfortunately, no process currently exists to generate this structure and not expose the materials to high temperature steps.

Another approach to increase mobility in silicon is to use super steep retrograde wells (SSRW). The term "retrograde well" indicates that the well is formed using an approach in which the highest concentration of dopant (implanted) in the well is located at a certain distance from the surface, which makes the gate electrode smaller and less susceptible to punch-through. The term "super-steep" indicates that the transition from the lower concentration of dopant to the higher concentration is fairly abrupt, i.e., a dopant profile has a super-steep attribute at the transition. SSRW devices are advantageous because they can have undoped silicon in the channel because short channel effects can be controlled by the steep well. A challenge relative to SSRW devices, however, is controlling dopant diffusion into the undoped silicon channel during the high temperature steps. The undesired diffusion can happen either from the steep wells or from source/drain extensions.

In view of the foregoing, there is a need in the art for a process that does not suffer from the problems of the related art.

SUMMARY OF THE INVENTION

The invention includes methods and resulting structure of forming a transistor having a high mobility channel. In one embodiment, the method includes providing a gate electrode including a gate material area and a gate dielectric, the gate electrode being positioned over a channel in a silicon substrate. A dielectric layer is formed about the gate electrode, and the gate material area and the gate dielectric are removed from the gate electrode to form an opening into a portion of the silicon substrate that exposes source/drain extensions. A high mobility semiconductor material, i.e., one having a carrier mobility greater than doped silicon, is then formed in the opening such that it laterally contacts the source/drain extensions. The gate dielectric and the gate material area may then be re-formed. This invention eliminates the high temperature steps after the formation of high mobility channel material used in related art methods.

A first aspect of the invention is directed to a method of forming a transistor having a high mobility channel, the method comprising the steps of: providing a gate electrode including a gate material area and a gate dielectric, the gate electrode being positioned over a channel and source/drain extensions in a silicon substrate; forming a dielectric layer about the gate electrode; removing the gate material area and the gate dielectric from the gate electrode to form an opening that extends into a portion of the silicon substrate including the source/drain extensions; forming a high mobility semiconductor material in the opening that laterally contacts the source/drain extensions in the silicon substrate; and re-forming the gate dielectric and the gate material area.

A second aspect of the invention includes a transistor comprising: a silicon substrate including a channel and source/drain extensions; a gate electrode including a gate material area and a gate dielectric on the silicon substrate; and a high mobility semiconductor material layer between the gate dielectric and the channel and extending into the silicon substrate to laterally contact the source/drain extensions within the silicon substrate.

A third aspect of the invention includes a method of forming a transistor having a high mobility channel, the method comprising the steps of: removing a sacrificial gate electrode including a gate material area and a gate dielectric to form an opening into a channel in an underlying silicon substrate, the opening exposing source/drain extensions; forming a high mobility semiconductor material in the opening that laterally contacts the source/drain extensions in the silicon substrate; and re-forming the gate dielectric and the gate material area in the opening.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
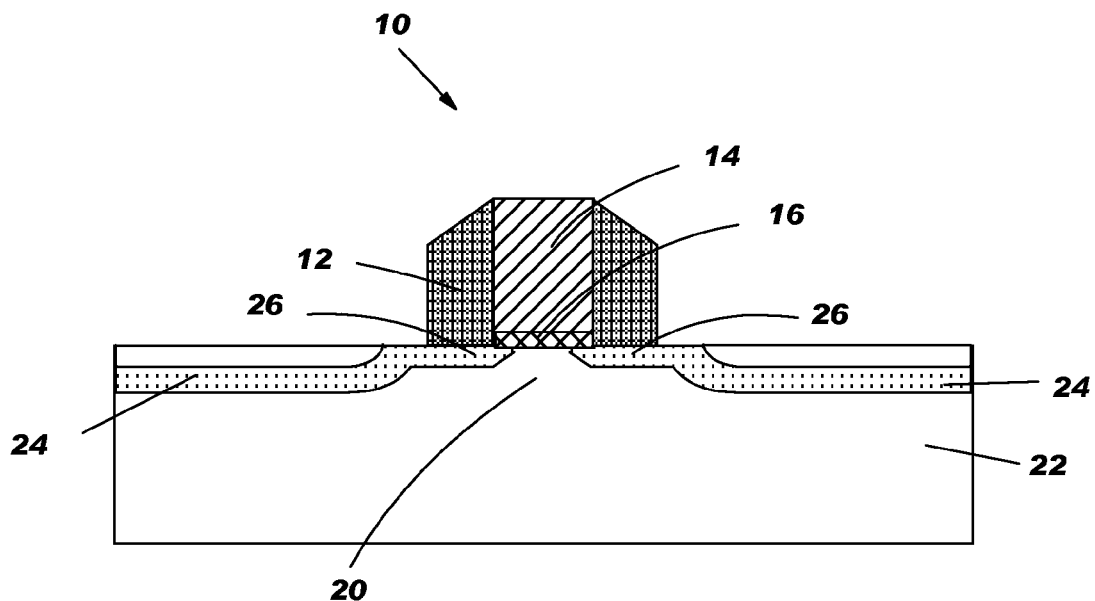
FIGS. 1-6 show a method of forming a transistor including a high mobility channel according to the invention.

With reference to the accompanying drawings, FIG. 1 illustrates an initial structure for a method of forming a transistor having a high mobility channel according to the invention. As shown, a (sacrificial) gate electrode 10 is provided including a spacer 12 surrounding a gate material area 14 and a gate dielectric 16. Gate electrode 10 is positioned over a channel or well 20 in a doped silicon substrate 22. Also shown are source-drain regions 24, and source/drain extensions 26. In one embodiment, channel 20 includes a super-steep retrograde well, as defined above. The type and amount of dopant in channel 20 will vary depending on the type of device desired. For example, for an nFET, the dopant would be p-type in channel 20.

Figure 2:
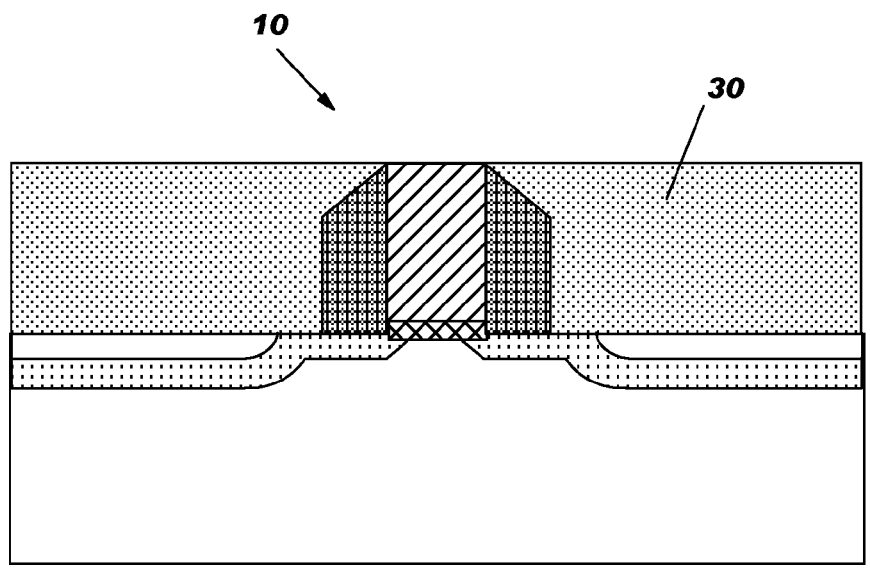
Figure 3:
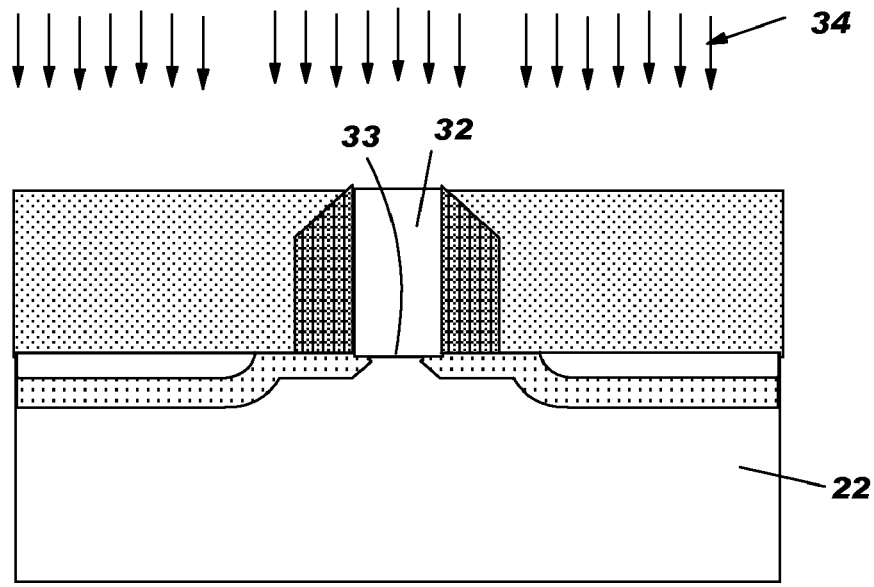
Figure 4:
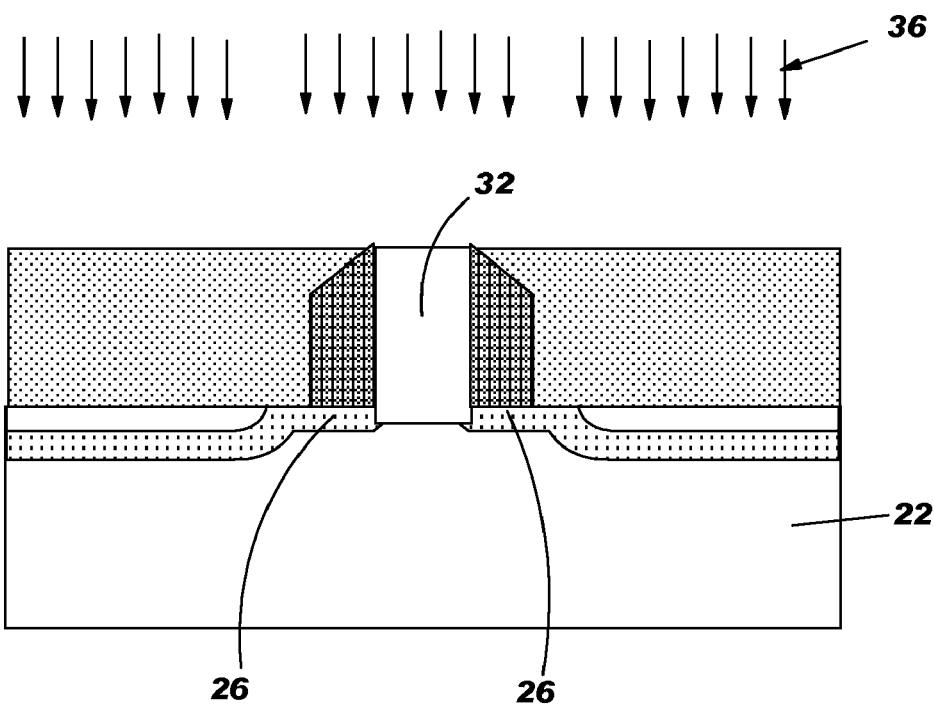

FIGS. 2-4 show the step of removing gate electrode 10 including gate material area 14 and gate dielectric 16 to form an opening 32 into channel 20 in underlying silicon substrate 22. As shown in FIG. 2, a step includes forming a dielectric layer 30 about gate electrode 10. Dielectric layer 30 may be formed by deposition of, for example, silicon dioxide ($SiO_2$) (preferred) or silicon nitride ($Si_3N_4$) in any conventional fashion, and chemical mechanical polishing (CMP) to planarize.

FIGS. 3-4 shows a next step in which gate material area 14 and gate dielectric 16 (FIG. 1) are removed from the gate electrode to form an opening 32 that extends into a portion of silicon substrate 22 including source/drain extensions 26. In one embodiment, as shown in FIG. 3, gate material area 14 and gate dielectric 16 are removed to an upper surface 33 of silicon substrate 20 by performing a conventional anisotropic etch 34, and then, as shown in FIG. 4, another etch 36 is conducted to extend opening 32 into silicon substrate 22 including source/drain extensions 26. However, the removal may be completed using a single step, if desired. Opening 32 exposes portions of source/drain extensions 26 in silicon substrate 22. That is, opening 32 cuts into source/drain extensions 26.

Figure 5:
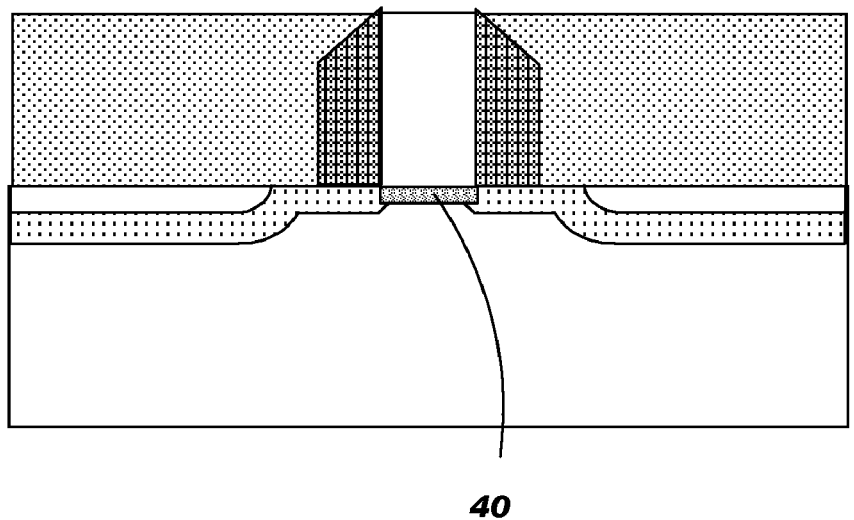
Figure 7:
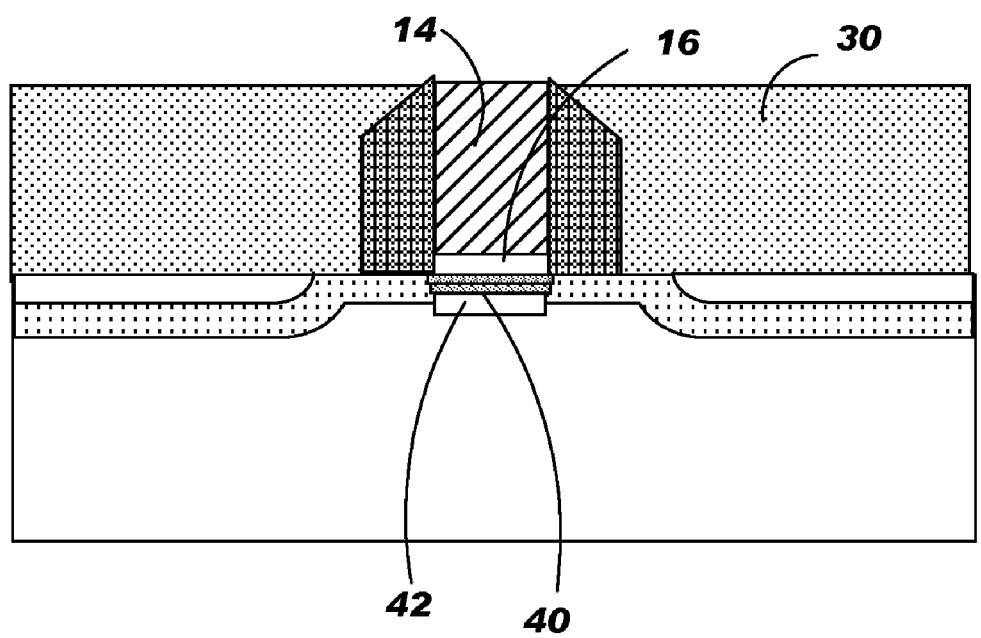
FIG. 7 shows alternative embodiments of the method of FIGS. 1-6.

Next, as shown in FIG. 5, a high mobility semiconductor material 40 is formed in opening 32, i.e., in a bottom of opening 32. Material 40 laterally contacts source/drain extensions 26, i.e., contacts extensions 26 vertical face to vertical face. In one embodiment, this step includes epitaxially growing high mobility semiconductor material 40, however, other processes of forming material 40 may also be used. If desired, material 40 layer may be formed of multiple layers (shown in FIG. 7). As used herein, "high mobility" means that material 40 has a carrier mobility, i.e., electron and/or hole mobility, higher than doped silicon. Material 40 is chosen from the group consisting of: undoped silicon, silicon germanium (SiGe), germanium (Ge), II-VI semiconductor material and III-V semiconductor material such as indium phosphate (InP) and gallium arsenic (GaAs). In one embodiment, as shown in FIG. 7, in the case that channel 20 includes a super-steep retrograde well, the method may also include epitaxially growing an undoped silicon layer 42 prior to forming high mobility semiconductor material 40.

Figure 6:
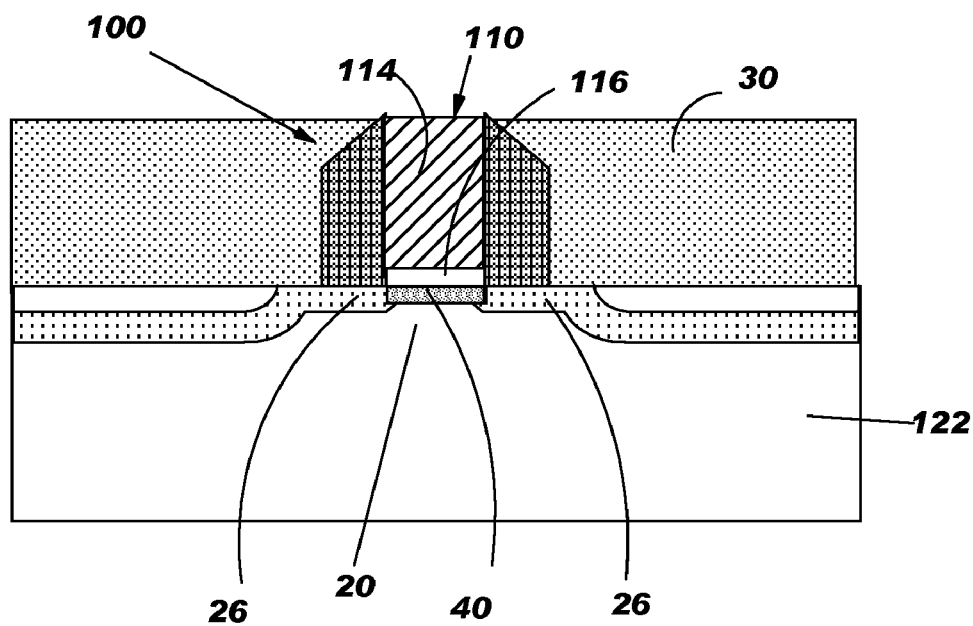

As shown in FIG. 6, a next step includes re-forming gate dielectric 16 and gate material area 14. Gate material area 14 may include any material that does not require high temperatures which would destroy the advantages of material 40, such as in-situ doped polysilicon or a metal. Subsequent processing may remove dielectric layer 30. Gate dielectric 16 may include, for example, at least one of silicon dioxide ($SiO_2$), oxynitride (ON), silicon nitride ($Si_3N_4$) and a high dielectric constant material. Subsequent processing may include any now known or later developed middle-of-line or back-end-of-line processing.

FIG. 6 also shows a transistor 100 according to the invention. Transistor 100 includes a silicon substrate 122 including a channel 20 and source/drain extensions 26, a gate electrode 110 including a gate material area 114 and a gate dielectric 116 on silicon substrate 122; and a high mobility semiconductor material layer 40 between gate dielectric 116 and channel 20 and extending into silicon substrate 122 such that material layer 40 laterally contacts source/drain extensions 26 within silicon substrate 122, i.e., below an upper surface of silicon substrate 122 such that extensions 26 meet material layer 40 in substantially vertical fashion. With this structure, high mobility semiconductor material layer 40 fully connects source/drain extensions 26, i.e. there is a low resistance path (e.g., <10 ohm-micron per unit width) between channel 20 and source/drain extensions 26.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming a transistor having a high mobility channel, the method comprising the steps of:
   providing a gate electrode including a gate material area and a gate dielectric, the gate electrode being positioned over a channel and source/drain extensions in a silicon substrate;
   forming a dielectric layer about the gate electrode;
   removing the gate material area and the gate dielectric from the gate electrode to form an opening that extends into a portion of the silicon substrate including the source/drain extensions;
   epitaxially growing a first high mobility semiconductor material in the opening that laterally contacts the source/drain extensions in the silicon substrate;
   epitaxially growing a second high mobility semiconductor material in the opening over the first high mobility semiconductor material; and
   re-forming the gate dielectric and the gate material area.

2. The method of claim 1, wherein the removing step includes etching to remove the gate material area and the gate dielectric from the gate electrode to form the opening to an upper surface of the silicon substrate, and then etching the silicon substrate to extend the opening into the silicon substrate including into the source/drain extensions.

3. The method of claim 1, wherein the first high mobility semiconductor material is chosen from the group consisting of: undoped silicon, silicon germanium (SiGe), germanium (Ge), indium phosphate (InP), gallium arsenic (GaAs), II-VI semiconductor material and III-V semiconductor material.

4. The method of claim 1, wherein in the case that the channel includes a super-steep retrograde well, the method further comprises the step of epitaxially growing an undoped silicon layer prior to forming the first high mobility semiconductor material.

5. The method of claim 1, wherein the gate dielectric includes at least one of silicon dioxide ($SiO_2$), oxynitride (ON), silicon nitride ($Si_3N_4$) and a high dielectric constant material.

6. The method of claim 1, wherein the gate material includes one of: in-situ doped polysilicon and a metal.

7. The method of claim 1, wherein the opening is not deeper than a bottom surface of each of the source/drain extensions.

8. The method of claim 1, wherein the first high mobility semiconductor material is distinct from the second high mobility semiconductor material, the second high mobility semiconductor material chosen from the group consisting of: undoped silicon, silicon germanium (SiGe), germanium (Ge), indium phosphate (InP), gallium arsenic (GaAs), II-VI semiconductor materal and III-V semiconductor material.

9. A method of forming a transistor having a high mobility channel, the method comprising the steps of:
   removing a sacrificial gate electrode including a gate material area and a gate dielectric to form an opening into a channel in an underlying silicon substrate, the opening exposing source/drain extensions;
   epitaxially growing a first high mobility semiconductor material in the opening that laterally contacts the source/drain extensions in the silicon substrate;
   epitaxially growing a second high mobility semiconductor material in the opening over the first high mobility semiconductor material; and
   re-forming the gate dielectric and the gate material area in the opening.

10. The method of claim 9, wherein the removing step includes etching to remove the gate material area and the gate dielectric from the gate electrode to form the opening to an upper surface of the underlying silicon substrate, and then etching silicon to extend the opening into the underlying silicon substrate including into the source/drain extensions.

11. The method of claim 9, wherein the first high mobility semiconductor material is chosen from the group consisting of: undoped silicon, silicon germanium (SiGe), germanium (Ge), indium phosphate (InP), gallium arsenic (GaAs), II-VI semiconductor materal and III-V semiconductor material.

12. The method of claim 9, wherein the opening is not deeper than a bottom surface of each of the source/drain extensions.

13. The method of claim 9, wherein the first high mobility semiconductor material is distinct from the second high mobility semiconductor material, the second high mobility semiconductor material chosen from the group consisting of: undoped silicon, silicon germanium (SiGe), germanium (Ge), indium phosphate (InP), gallium arsenic (GaAs), II-VI semiconductor materal and III-V semiconductor material.

* * * * *